United States Patent
Dutta et al.

(10) Patent No.: US 11,121,173 B2
(45) Date of Patent: Sep. 14, 2021

(54) PRESERVING UNDERLYING DIELECTRIC LAYER DURING MRAM DEVICE FORMATION

(71) Applicant: International Business Machines Corporation, Armonk, NY (US)

(72) Inventors: Ashim Dutta, Menands, NY (US); Michael Rizzolo, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/662,732

(22) Filed: Oct. 24, 2019

(65) Prior Publication Data

US 2021/0126051 A1   Apr. 29, 2021

(51) Int. Cl.
| | | |
|---|---|---|
| *H01L 27/22* | (2006.01) | |
| *H01L 21/263* | (2006.01) | |
| *H01L 43/10* | (2006.01) | |
| *H01L 43/12* | (2006.01) | |
| *H01L 23/538* | (2006.01) | |

(52) U.S. Cl.
CPC ........ *H01L 27/222* (2013.01); *H01L 21/2633* (2013.01); *H01L 23/5385* (2013.01); *H01L 43/10* (2013.01); *H01L 43/12* (2013.01)

(58) Field of Classification Search
CPC .............. H01L 27/222; H01L 21/2633; H01L 23/5385; H01L 43/10; H01L 43/12
See application file for complete search history.

(56) References Cited

U.S. PATENT DOCUMENTS

| | | |
|---|---|---|
| 6,785,159 B2 | 8/2004 | Tuttle |
| 7,291,556 B2 | 11/2007 | Choi et al. |
| 8,334,213 B2 | 12/2012 | Mao |
| 8,674,465 B2 | 3/2014 | Li et al. |
| 8,883,520 B2 | 11/2014 | Satoh et al. |
| 9,034,710 B2 | 5/2015 | Sills et al. |
| 9,705,071 B2 | 7/2017 | Annunziata et al. |
| 9,780,301 B1 * | 10/2017 | Chuang .................. H01L 43/02 |
| 10,269,401 B2 * | 4/2019 | Seo ........................ H01L 27/228 |
| 10,770,653 B1 * | 9/2020 | Penny .................... G11C 11/161 |
| 2010/0022030 A1 | 1/2010 | Ditizio |
| 2015/0249209 A1 * | 9/2015 | Lu .......................... H01L 27/222 |
| | | 257/421 |
| 2018/0069175 A1 | 3/2018 | Bak et al. |

(Continued)

*Primary Examiner* — Mark W Tornow
(74) *Attorney, Agent, or Firm* — L. Jeffrey Kelly; Michael J. Chang, LLC

(57) ABSTRACT

Techniques for preserving the underlying dielectric layer during MRAM device formation are provided. In one aspect, a method of forming an MRAM device includes: depositing a first dielectric cap layer onto a substrate over logic and memory areas of the substrate; depositing a sacrificial metal layer onto the first dielectric cap layer; patterning the sacrificial metal layer, wherein the patterned sacrificial metal layer is present over the first dielectric cap layer in at least the logic area; depositing a second dielectric cap layer onto the first dielectric cap layer; forming an MRAM stack on the second dielectric cap layer; patterning the MRAM stack using ion beam etching into at least one memory cell, wherein the patterned sacrificial metal layer protects the first dielectric cap layer in the logic area; and removing the patterned sacrificial metal layer. An MRAM device is also provided.

17 Claims, 9 Drawing Sheets

(56) References Cited

U.S. PATENT DOCUMENTS

| | | |
|---|---|---|
| 2018/0261759 A1 | 9/2018 | Bhosale et al. |
| 2019/0386210 A1* | 12/2019 | Rizzolo .................. H01L 43/02 |
| 2020/0106006 A1* | 4/2020 | Boone .................... H01L 43/12 |
| 2020/0127194 A1* | 4/2020 | Rizzolo .................. H01L 43/12 |

* cited by examiner

PRESERVING UNDERLYING DIELECTRIC LAYER DURING MRAM DEVICE FORMATION

FIELD OF THE INVENTION

The present invention relates to magnetic random access memory (MRAM) devices, and more particularly, to techniques for preserving the underlying dielectric layer during MRAM device formation.

BACKGROUND OF THE INVENTION

Magnetic random access memory (MRAM) devices employ a magnetic tunnel junction (MTJ) to store information. An MTJ includes a fixed magnetic metal layer(s) separated from a free magnetic metal layer(s) by a tunnel barrier. The orientation of the free magnetic layer(s) relative to that of the fixed magnetic layer(s) is used to store the information, e.g., as a logic "1" or logic "0." The MTJ is often sandwiched between a top electrode and a bottom electrode.

MRAM devices are typically formed by first depositing the various layers of the device (including the MTJ), and then patterning the layers into individual memory cell pillars using a process such as ion beam etching. However, with embedded MRAM designs a significant gouging of the dielectric underlying the bottom electrode occurs during the MTJ stack etch.

In extreme cases, this gouging can remove so much of the underlying dielectric that the lower interconnect levels become exposed. Among other drawbacks, exposed copper lines can undesirably lead to copper contamination during downstream processes.

With conventional process, this dielectric gouging can only be reduced by reducing the ion beam over etch and clean-up time. Doing so, however, induces footing at the base of the MRAM memory cell pillars and leaves metal residue on the MTJ sidewall causing junction shorts.

Thus, improved techniques for MRAM device formation that maximize preservation of the underlying dielectric during MTJ patterning without compromising ion beam over etch and clean-up time would be desirable.

SUMMARY OF THE INVENTION

The present invention provides techniques for preserving the underlying dielectric layer during magnetic random access memory (MRAM) device formation. In one aspect of the invention, a method of forming an MRAM device is provided. The method includes: depositing a first dielectric cap layer onto a substrate over a logic area and a memory area of the substrate; depositing a sacrificial metal layer onto the first dielectric cap layer; patterning the sacrificial metal layer, wherein the patterned sacrificial metal layer is present over the first dielectric cap layer in at least the logic area of the substrate; depositing a second dielectric cap layer onto the first dielectric cap layer over the patterned sacrificial metal layer; forming an MRAM stack on the second dielectric cap layer; patterning the MRAM stack using ion beam etching into at least one memory cell in the memory area of the substrate, wherein the patterned sacrificial metal layer protects the first dielectric cap layer in the logic area of the substrate during the patterning of the MRAM stack; and removing the patterned sacrificial metal layer. The patterned sacrificial metal layer can also be present over the first dielectric cap layer in the memory area of the substrate to protect the first dielectric cap layer in the memory area of the substrate during the patterning of the MRAM stack.

In another aspect of the invention, an MRAM device is provided. The MRAM device includes: a substrate; a first dielectric cap layer disposed onto the substrate over a logic area and a memory area of the substrate; a second dielectric cap layer disposed on the first dielectric cap layer; at least one memory cell on the second dielectric cap layer in the memory area of the substrate, wherein the at least one memory cell comprises a bottom electrode, an MTJ disposed on the bottom electrode, and a top electrode disposed on the MTJ, and wherein the first dielectric cap layer has a thickness of from about 20 nm to about 100 nm and ranges therebetween in the logic area (and also optionally in the memory area) of the substrate; and spacers along sidewalls of the at least one memory cell.

A more complete understanding of the present invention, as well as further features and advantages of the present invention, will be obtained by reference to the following detailed description and drawings.

DETAILED DESCRIPTION OF PREFERRED EMBODIMENTS

As provided above, in order to prevent excessive gouging of the underlying dielectric during magnetic tunnel junction patterning, conventional ion beam etching-based approaches to magnetic random access memory (MRAM) device fabrication reduce the ion beam over etch and clean-up time. Unfortunately, this approach leads to formation of foot flares at the base of the MRAM memory cell pillars and undesirably leaves metal residue on the MTJ sidewall. Metal residue along the MTJ sidewalls can cause shorts across the junction.

Advantageously, provided herein are techniques for preserving the underlying dielectric layer during MRAM device formation using a sacrificial metal layer to protect the dielectric underlying the bottom electrode (also referred to herein as the "bottom electrode dielectric") from gouging during ion beam etching of the MTJ stack. The term "sacrificial," as used herein, refers to the notion that the metal layer is used during the ion beam etching phase (to protect the bottom electrode dielectric) and then later removed.

As will be described in detail below, the present techniques may be employed in the formation of embedded MRAM devices, i.e., where the MRAM devices are integrated with other devices such as logic devices on the same chip—for instance in memory and logic areas of the chip, respectively. The logic devices can include, but are not limited to, transistors such as field-effect transistors (FETs), capacitors, resistors, etc. Namely, as will be described in detail below, in one exemplary embodiment presented herein, the sacrificial metal layer is embedded in the bottom electrode dielectric in the logic area to protect the bottom electrode dielectric underneath the sacrificial metal layer during the ion beam etching. In another exemplary embodiment presented herein, the sacrificial metal layer is embedded in the bottom electrode dielectric in both the memory and logic areas to protect the bottom electrode dielectric underneath the sacrificial metal layer during the ion beam etching. In either case, the sacrificial metal layer is removed after MTJ pillar formation, encapsulation, and encapsulation etch back. As such, a more aggressive ion beam etching main etch and clean-up conditions can be used to remove the bottom electrode foot and clean/remove the sidewall residue without any concerns of underlying dielectric recess.

Figure 1:
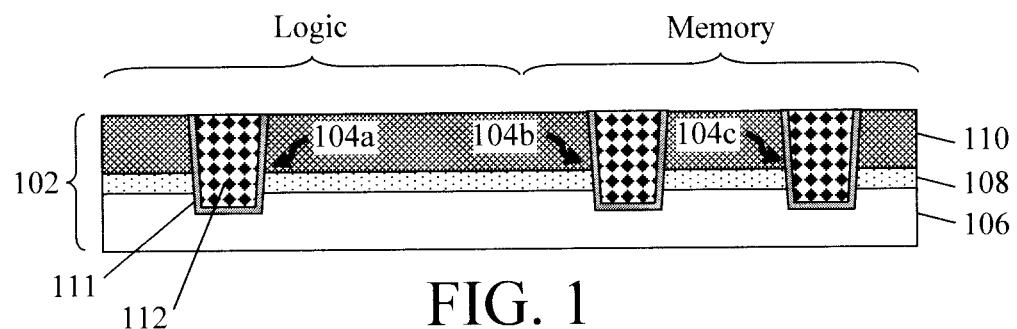
FIG. 1 is a cross-sectional diagram illustrating a substrate having (first) interconnects formed therein in both Logic and Memory areas of the substrate according to an embodiment of the present invention.
Figure 2:
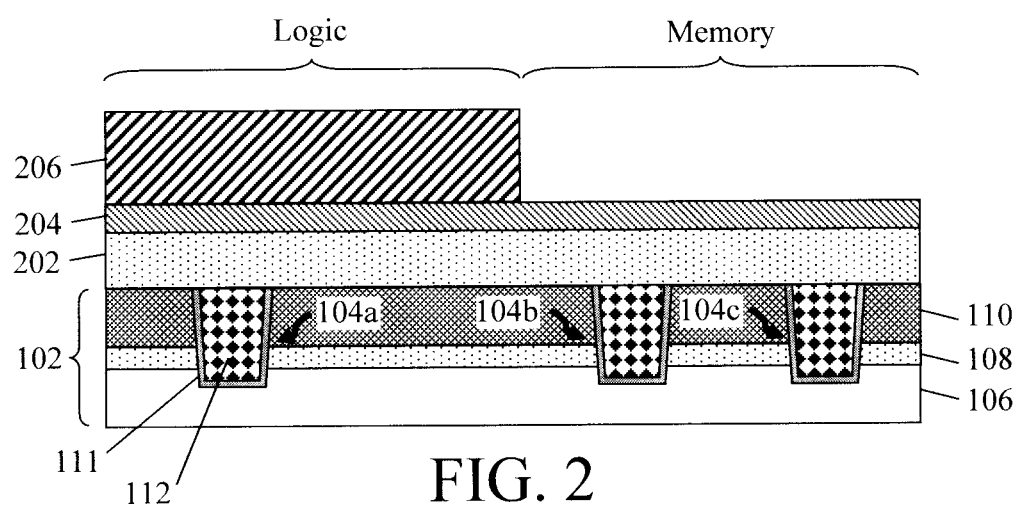
FIG. 2 is a cross-sectional diagram illustrating a (first) dielectric cap layer having been deposited onto the substrate over the first interconnects, a sacrificial metal layer having been deposited onto the first dielectric cap layer, and a patterned block mask having been formed over the sacrificial metal layer covering/masking sacrificial metal layer in the Logic area according to an embodiment of the present invention.

A methodology for forming an MRAM device according to a first exemplary embodiment is now described by way of reference to FIGS. 1-11. As shown in FIG. 1, the process begins with a substrate 102 having first (electrically-conductive) interconnects 104a, 104b, 104c, etc. formed therein. Although not shown in the figures, substrate 102 can contain one or more device elements such as field-effect transistors (FETs), resistors, capacitors, etc. formed using standard complementary metal oxide semiconductor (CMOS)-compatible fabrication processes.

According to an exemplary embodiment, substrate 102 includes multiple dielectric layers including, but not limited to, a first dielectric layer 106, a second dielectric layer 108 disposed on first dielectric layer 106, and a third dielectric layer 110 disposed on second dielectric layer 108. Each of dielectric layer 106, dielectric layer 108 and dielectric layer 110 can be deposited using a process such as chemical vapor deposition (CVD), atomic layer deposition (ALD) or physical vapor deposition (PVD). According to an exemplary embodiment, dielectric layer 106 and dielectric layer 108 each has a thickness of from about 10 nanometers (nm) to about 50 nm and ranges therebetween, and dielectric layer 110 has a thickness of from about 5 nm to about 20 nm and ranges therebetween.

Suitable materials for the dielectric layer 106 and the dielectric layer 110 include, but are not limited to, oxide low-κ materials such as silicon oxide (SiOx) and/or oxide ultralow-κ interlayer dielectric (ULK-ILD) materials, e.g., having a dielectric constant κ of less than 2.7. By comparison, silicon dioxide (SiO$_2$) has a dielectric constant κ value of 3.9. Suitable ultralow-κ dielectric materials include, but are not limited to, porous organosilicate glass (pSiCOH). Suitable materials for the dielectric layer 108 include, but are not limited to, nitride materials such as silicon nitride (SiN) and/or silicon carbon nitride (SiCN). Use of an oxide/nitride/oxide configuration facilitates formation of the interconnects 104a, 104b, 104c, etc. in substrate 102 (see below), e.g., with dielectric layer 108 acting as an etch stop.

Namely, according to an exemplary embodiment, interconnects 104a, 104b, 104c, etc. are formed in substrate 102 using standard lithography and etching techniques to first pattern vias in substrate 102 and then filling the vias with a contact metal (or combination of metals) 112. With standard lithography and etching processes, a lithographic stack (not shown), e.g., photoresist/organic planarizing layer (OPL)/anti-reflective coating (ARC), is used to pattern a hardmask (not shown). The pattern from the hardmask is then transferred to the underlying substrate 102. The hardmask is then removed. A directional (anisotropic) etching process such as reactive ion etching (RIE) or a series of RIE steps can be employed for patterning the vias. For instance, an oxide-selective RIE can be employed to pattern the vias in dielectric layer 110 with the dielectric layer 108 acting as an etch stop. A nitride-selective RIE can then be employed to extend the vias through dielectric layer 108 with dielectric layer 106 acting as an etch stop. Finally, an oxide-selective RIE can then be employed to extend the vias into dielectric layer 106. This final RIE step is endpointed when the vias extend partway through dielectric layer 106.

Suitable contact metals include, but are not limited to, copper (Cu), tungsten (W), ruthenium (Ru), cobalt (Co), nickel (Ni) and/or platinum (Pt). The contact metal(s) 112 can be deposited into the vias using a process such as evaporation, sputtering, or electrochemical plating. Following deposition, the overburden can be removed using a process such as chemical-mechanical polishing (CMP). Prior to depositing the contact metal(s) 112 into the vias, a conformal barrier layer 111 can be deposited into and lining the vias. Use of such a barrier layer 111 helps to prevent diffusion of the contact metal(s) into the surrounding dielectric. Suitable barrier layer materials include, but are not limited to, ruthenium (Ru), tantalum (Ta), tantalum nitride (TaN), titanium (Ti), and/or titanium nitride (TiN). Additionally, a seed layer (not shown) can be deposited into and lining the vias prior to contact metal deposition. A seed layer facilitates plating of the contact metal into the vias.

In the present example, an integrated circuit will be fabricated containing the MRAM device in a Memory area of the integrated circuit adjacent to a Logic area of the integrated circuit. Advantageously, a sacrificial metal layer will be employed during the MRAM MTJ ion beam etch patterning to protect the underlying bottom electrode dielectric (see dielectric cap layer 202—described below).

A (first) dielectric cap layer 202 is then deposited onto substrate 102 over interconnects 104a, 104b, 104c, etc. See FIG. 2. Suitable materials for dielectric cap layer 202 include, but are not limited to, materials such as silicon carbide (SiC), SiN, SiCN and/or hydrogen containing silicon carbon nitride (SiCNH). Dielectric cap layer 202 can be deposited onto substrate 102 using a process such as CVD, ALD or PVD. According to an exemplary embodiment, dielectric cap layer 202 has a thickness of from about 20 nm to about 100 nm and ranges therebetween.

A sacrificial metal layer 204 is then deposited onto the dielectric cap layer 202. Suitable materials for sacrificial metal layer 204 include, but are not limited to, tantalum nitride (TaN), titanium nitride (TiN) and/or any other wet removable metal/metal-containing films. Sacrificial metal layer 204 can be deposited onto dielectric cap layer 202 using a process such as CVD, ALD or PVD. According to an exemplary embodiment, sacrificial metal layer 204 has a thickness of from about 10 nm to about 100 nm and ranges therebetween. In this exemplary embodiment, sacrificial metal layer 204 will serve to prevent gouging of dielectric cap layer 202 in the Logic area during the ion beam etch of the MTJ (see below).

Namely, a patterned block mask 206 is next formed over sacrificial metal layer 204 covering/masking sacrificial metal layer 204 in the Logic area. See FIG. 2. Standard lithography and (dry or wet) etching techniques (see above) can be employed to pattern the block mask. Suitable block mask materials include, but are not limited to, organic planarizing layer (OPL) materials.

Figure 3:
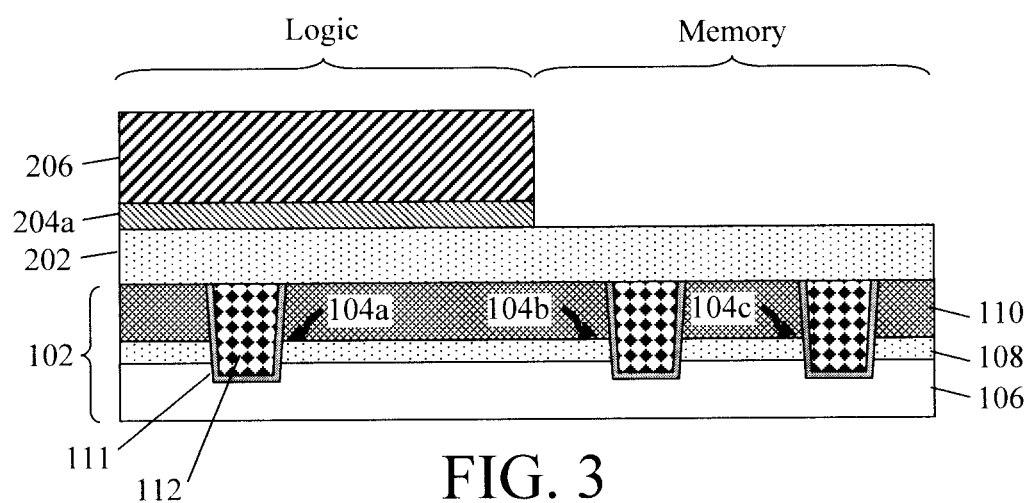
FIG. 3 is a cross-sectional diagram illustrating the sacrificial metal layer having been patterned using the block mask according to an embodiment of the present invention.
Figure 4:
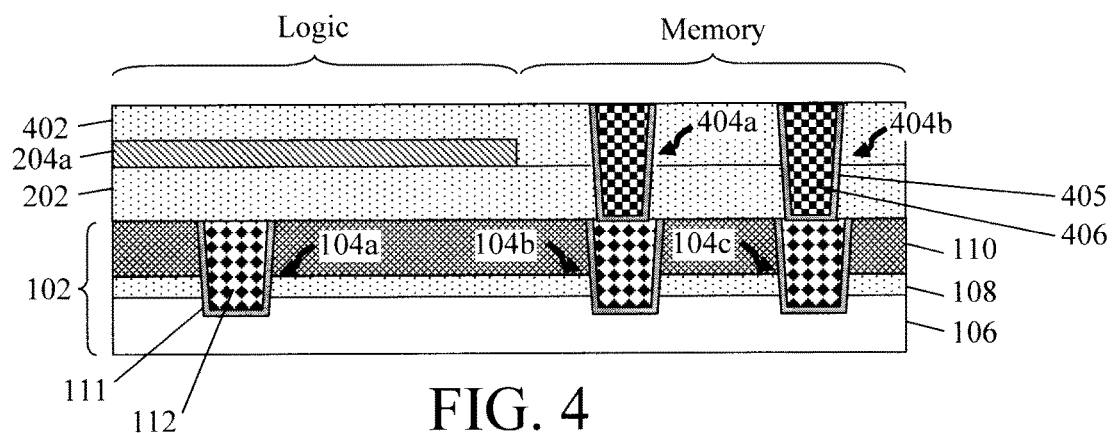
FIG. 4 is a cross-sectional diagram illustrating a (second) dielectric cap layer having been deposited onto the first dielectric cap layer over and burying the patterned sacrificial metal layer, and (second) interconnects having been formed in the first/second dielectric cap layers in contact with the first interconnects in the Memory area of the substrate according to an embodiment of the present invention.

As shown in FIG. 3, sacrificial metal layer 204 is then patterned using block mask 206. According to an exemplary embodiment, a selective directional (anisotropic) etching process such as metal-selective RIE is employed to pattern the sacrificial metal layer 204. As a result of this patterning, sacrificial metal layer 204 is now present over only the Logic area. The patterned portion of sacrificial metal layer 204 that remains over dielectric cap layer 202 in the Logic area of substrate 102 is now given reference numeral 204a. Following patterning of sacrificial metal layer 204, the block mask 206 is removed.

A (second) dielectric cap layer 402 is then deposited onto dielectric cap layer 202 over and burying the patterned portion 204a of sacrificial metal layer 204. See FIG. 4. Following deposition, dielectric cap layer 402 is polished using a process such as CMP. According to an exemplary embodiment, the same material is used for dielectric cap layer 402 as for dielectric cap layer 202, e.g., SiC, SiN SiCN and/or SiCNH. Dielectric cap layer 402 can be deposited onto dielectric cap layer 202 using a process such as CVD, ALD or PVD. According to an exemplary embodiment, dielectric cap layer 402 has a thickness of from about 20 nm to about 100 nm and ranges therebetween.

Figure 5:
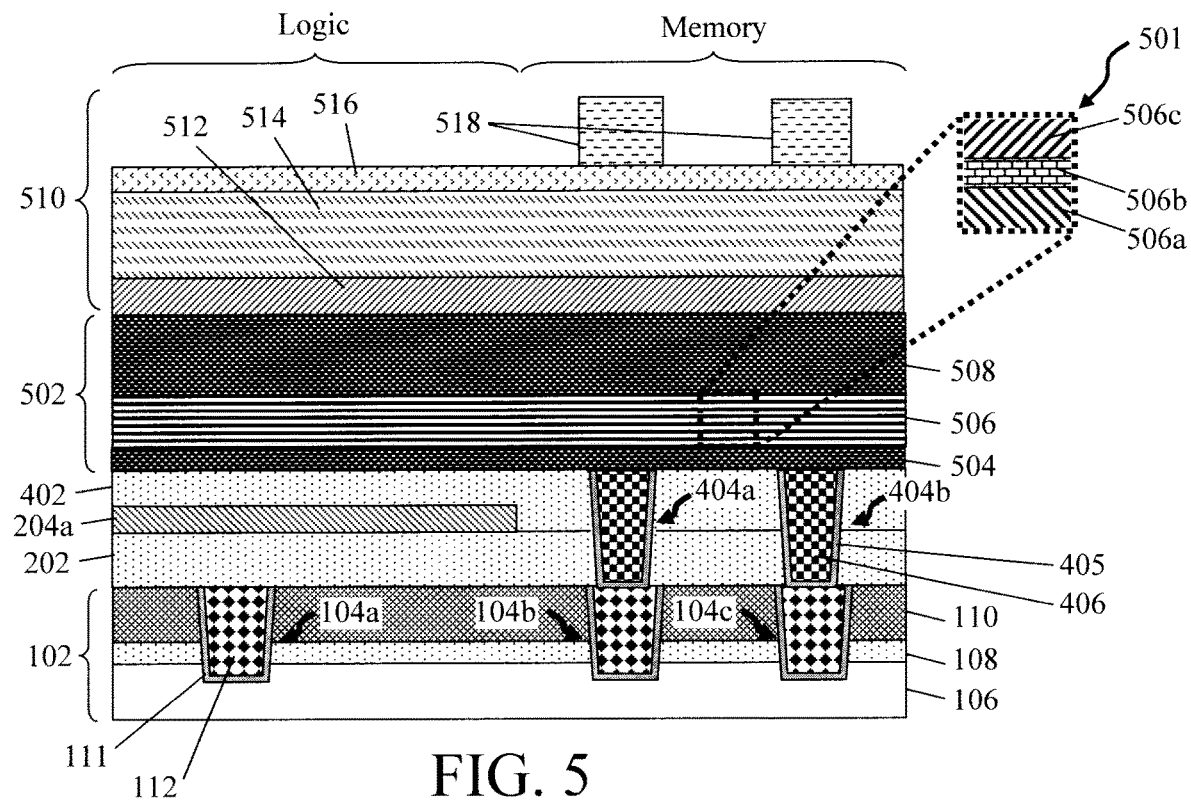
FIG. 5 is a cross-sectional diagram illustrating an MRAM stack having been formed on the first/second dielectric cap layers over the first/second interconnects, and a lithographic stack having been formed on the MRAM stack according to an embodiment of the present invention.
Figure 6:
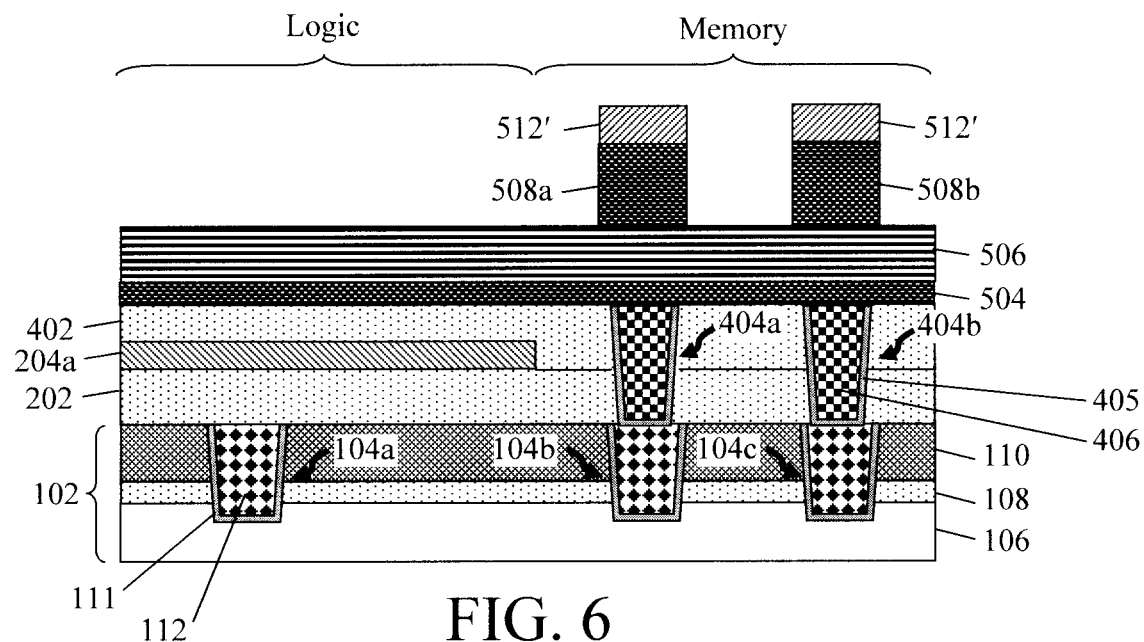
FIG. 6 is a cross-sectional diagram illustrating the lithographic stack having been used to pattern a top electrode layer of the MRAM stack into individual top electrodes according to an embodiment of the present invention.

Second electrically-conductive interconnects 404a, 404b, etc. are formed in dielectric cap layer 202/dielectric cap layer 402. In this exemplary embodiment, interconnects 404a, 404b, etc. are formed in dielectric cap layer 202/dielectric cap layer 402 over and in contact with interconnects 104b and 104c in the Memory area of substrate 202. According to an exemplary embodiment, interconnects 404a, 404b, etc. are formed using standard lithography and etching techniques (see above) to first pattern vias in dielectric cap layer 202/dielectric cap layer 402 and then filling the vias with a contact metal (or combination of metals) 406. A directional (anisotropic) etching process such as RIE can be employed for patterning the vias. As provided above, suitable contact metals include, but are not limited to, Cu, W, Co, Ru, Ni and/or Pt. The contact metal(s) 406 can be deposited into the vias using a process such as evaporation, sputtering, or electrochemical plating. Following deposition, the overburden can be removed using a process such as CMP. Prior to depositing the contact metal(s) 406 into the vias, a conformal barrier layer 405 can be deposited into and lining the vias. Use of such a barrier layer 405 helps to prevent diffusion of the contact metal(s) into the surrounding dielectric. As provided above, suitable barrier layer materials include, but are not limited to, Ru, Ta, TaN, Ti, and/or TiN. Additionally, a seed layer (not shown) can be deposited into and lining the vias prior to contact metal deposition, i.e., to facilitate plating of the contact metal into the vias. An MRAM stack 502 is then formed on dielectric cap layer 202/dielectric cap layer 402 over interconnects 104b and 104c/interconnects 404a, 404b, etc. As shown in FIG. 5, MRAM stack 502 includes a bottom electrode layer 504 disposed on dielectric cap layer 402, an MTJ layer 506 disposed on the bottom electrode layer 504, and a top electrode layer 508 disposed on the MTJ layer 506. Suitable materials for the bottom electrode layer 504 and the top electrode layer 508 include, but are not limited to, niobium (Nb), niobium nitride (NbN), tungsten (W), tungsten nitride (WN), tantalum (Ta), tantalum nitride (TaN), titanium (Ti), titanium nitride (TiN), ruthenium (Ru), molybdenum (Mo), chromium (Cr), vanadium (V), palladium (Pd), platinum (Pt), rhodium (Rh), scandium (Sc) and/or aluminum (Al). A process such as CVD or PVD can be employed to deposit bottom electrode layer 504 onto the dielectric cap layer 402 and/or to deposit top electrode layer 508 onto the MTJ layer 506. According to an exemplary embodiment, bottom electrode layer 504 has thickness of from about 5 nm to about 30 nm and ranges therebetween, and top electrode layer 508 has a thickness of from about 50 nm to about 150 nm and ranges therebetween.

MTJ layer 506 can have a variety of different configurations. In general, however, MTJ layer 506 includes at least one fixed (or reference) layer 506a separated from at least one free layer 506c by a tunnel barrier layer 506b. See magnified view 501. Suitable materials for the fixed layer(s) 506a and the free layer(s) 506c include, but are not limited to, a metal or combination of metals such as cobalt (Co), iron (Fe), nickel (Ni), manganese (Mn), Pt, Pd, ruthenium (Ru), and combinations thereof, e.g., alloys containing at least one of the foregoing metals such as CoFeB. A process such as evaporation or sputtering can be employed to deposit fixed layer(s) 506a onto bottom electrode layer 504 and/or to deposit free layer(s) 506c onto tunnel barrier layer 506b. According to an exemplary embodiment, fixed layer(s) 506a and free layer(s) 506c each have a thickness of from about 2 nm to about 10 nm and ranges therebetween. Suitable materials for tunnel barrier layer 506b include, but are not limited to, aluminum oxide (AlOx) and/or magnesium oxide (MgO). A process such as CVD, ALD or PVD can be employed to deposit tunnel barrier layer 506b onto bottom electrode layer 504. According to an exemplary embodiment, tunnel barrier layer 506b has a thickness of from about 2 nm to about 10 nm and ranges therebetween.

In order to pattern MRAM stack 502, a standard lithographic stack 510 is formed on the MRAM stack 502. As shown in FIG. 5, lithographic stack 502 includes a hardmask layer 512 (e.g., silicon nitride (SiN) and/or silicon dioxide (SiO₂)) disposed on the MRAM stack 502, an organic planarizing layer (OPL) 514 disposed on the hardmask layer 512, an antireflective coating (ARC) layer 516 disposed on the OPL 514, and a patterned photoresist 518 disposed on the ARC layer 516. The patterned photoresist 518 marks the footprint and location of MRAM memory cells that will be patterned in MRAM stack 502 over interconnects 104b and 104c/interconnects 404a, 404b, etc. in the Memory area of the substrate 102 (see below).

Standard lithography and etching techniques (see above) using, e.g., a directional (anisotropic) etching process such as RIB, are then employed to transfer the pattern from patterned photoresist 518 to hardmask layer 512, after which any remaining OPL 514, ARC layer 516 and photoresist 518 are removed. See FIG. 6. The patterned hardmask layer 512 is now given the reference numeral 512'. The pattern from patterned hardmask layer 512' is then transferred to the top electrode layer 508 to pattern the top electrode layer 508 into at least a first top electrode 508a and a second top electrode 508b. According to an exemplary embodiment, reactive ion etching (RIE) or ion beam etching is used to pattern the top electrode layer 508.

Figure 7:
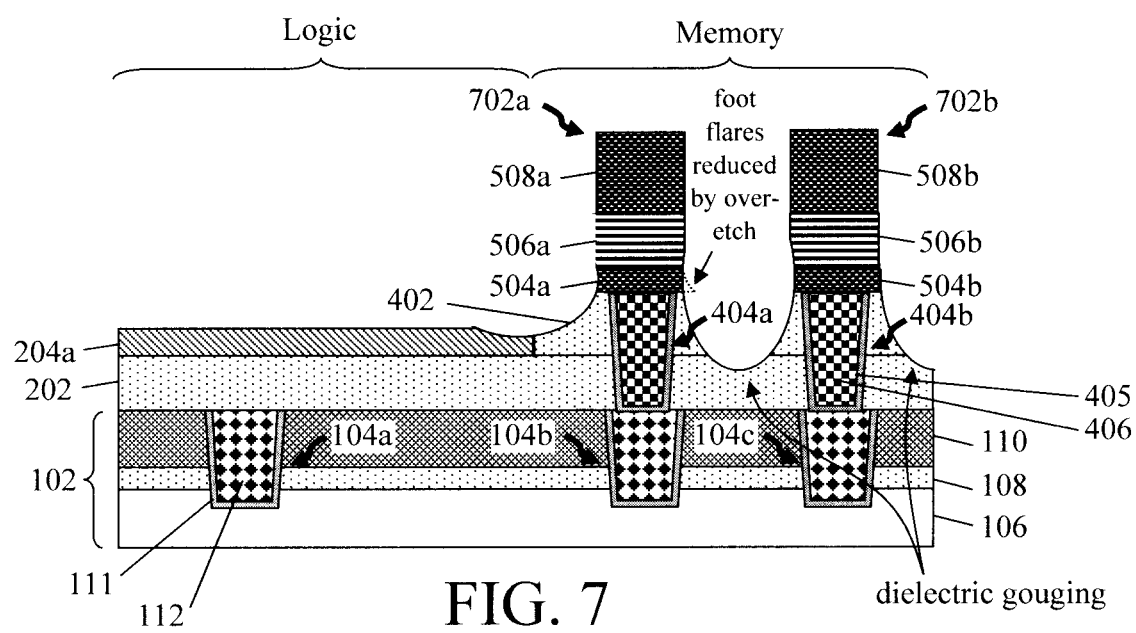
FIG. 7 is a cross-sectional diagram illustrating an etch of an MTJ layer and a bottom electrode layer of the MRAM stack having been performed to form at least a first memory cell and a second memory cell from the MRAM stack in the Memory area of the substrate, while the patterned sacrificial metal layer protects the underlying dielectric cap layer in the Logic area of the substrate according to an embodiment of the present invention.
Figure 8:
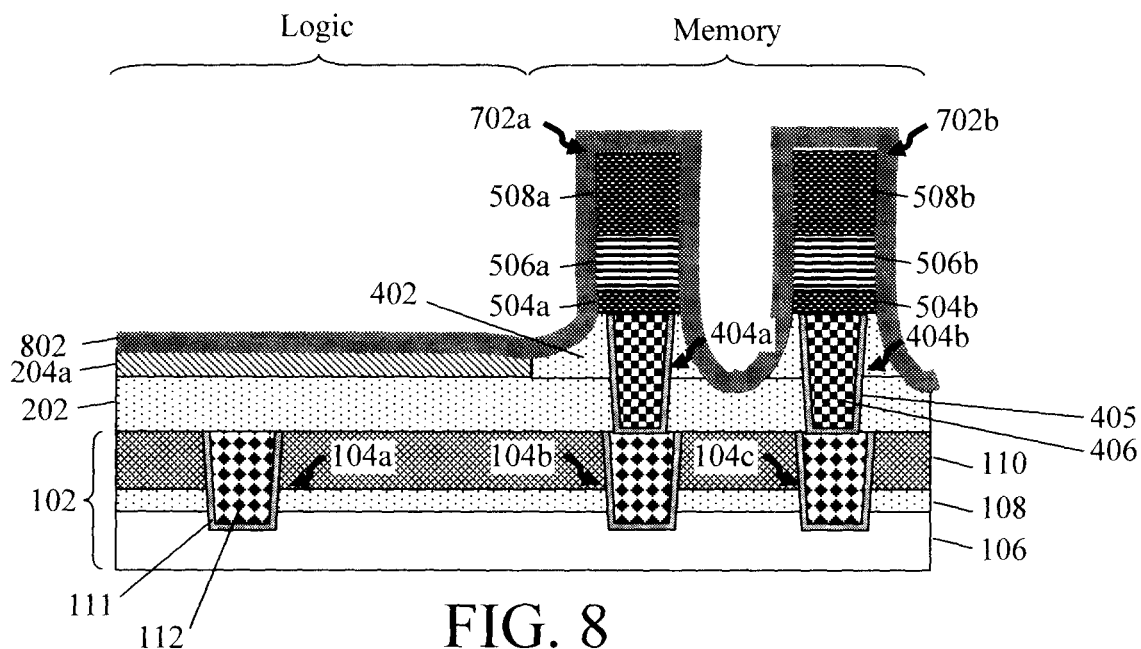
FIG. 8 is a cross-sectional diagram illustrating a conformal dielectric encapsulation layer having been deposited over the memory cells according to an embodiment of the present invention.
Figure 9:
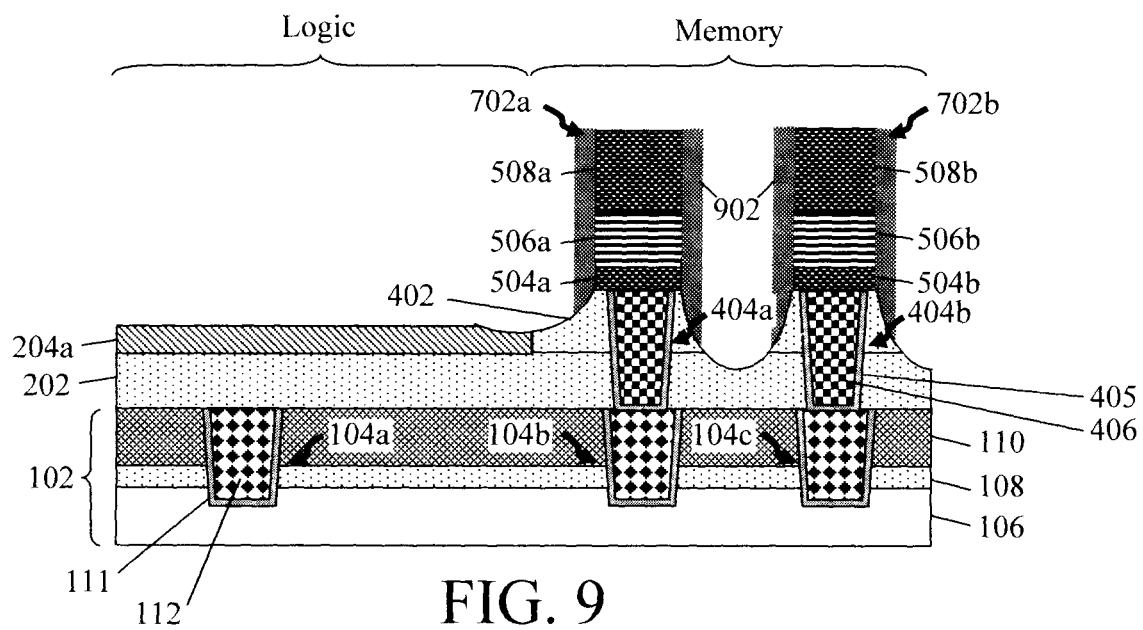
FIG. 9 is a cross-sectional diagram illustrating an etch-back of the encapsulation layer having been performed to form spacers along the sidewalls of the memory cells according to an embodiment of the present invention.
Figure 10:
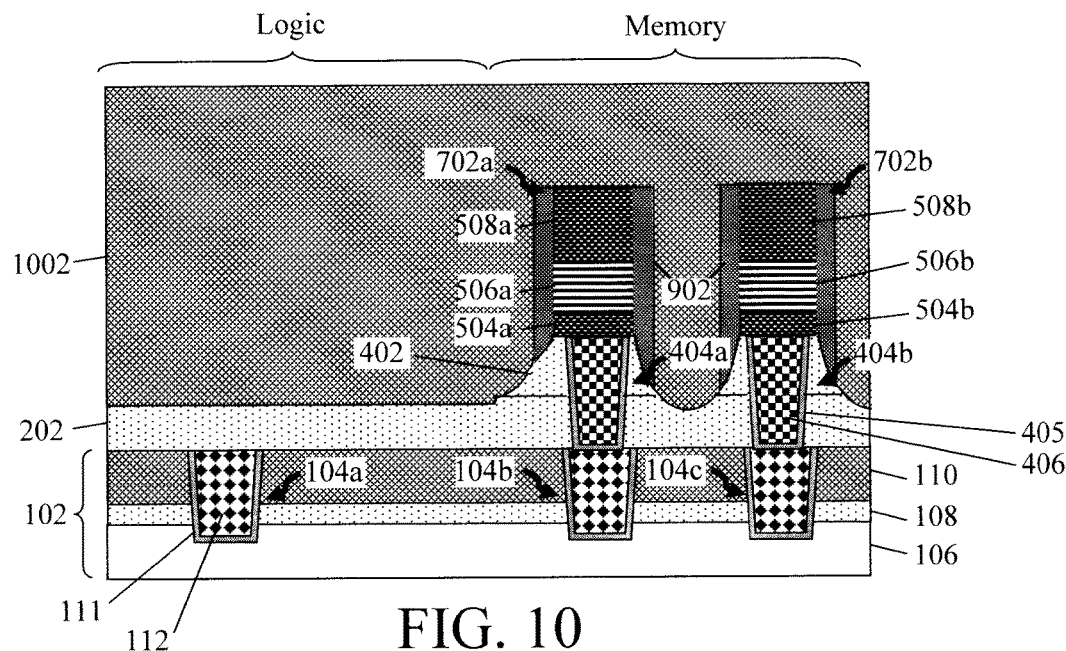
FIG. 10 is a cross-sectional diagram illustrating the patterned sacrificial metal layer having been removed, and an ILD having been deposited over the Logic and Memory areas of the substrate, surrounding the memory cells according to an embodiment of the present invention.

An ion beam etch of MTJ layer 506 and bottom electrode layer 504 is then performed to form at least a first memory cell 702a and a second memory cell 702b from MRAM stack 502 in the Memory area of the substrate 102 (after which patterned hardmask layer 512' is removed). See FIG. 7. The patterned MTJ layer 506 forms at least a first MTJ 506a and a second MTJ 506b in memory cell 702a and memory cell 702b, respectively. The patterned bottom electrode layer 504 forms at least a first bottom electrode 504a and a second bottom electrode 504b in memory cell 702a and memory cell 702b, respectively. As shown in FIG. 7, memory cell 702a is formed over interconnects 404a/104b, and memory cell 702b is formed over interconnects 404b/104c, etc.

The ion beam etch of MTJ layer 506 and bottom electrode layer 504 lands on the underlying dielectric, i.e., dielectric cap layers 402/202. According to an exemplary embodiment, this ion beam etch to form memory cells 702a and 702b involves an over-etch to reduce foot flares in the bottom electrodes 504a and 504a, followed by a clean-up ion beam etching. Namely, without an over etch, foot flares (as indicated by dashed lines in FIG. 7) would be prevalent on both sides of bottom electrodes 504a and 504b, which is undesirable. Use of an over-etch, however, results in gouging of the underlying dielectric cap layers 402/202 at the base of the memory cells 702a and 702b in the Memory area of substrate 202. Further, the ion beam etch of bottom electrode layer 504 can redistribute metal along the sidewalls of MTJs 506a and 506b potentially leading to shorts across the junction, which is then covered over by dielectric from the over-etch. Thus, the clean-up ion beam etch is performed to remove this redistributed metal/dielectric from the MTJ sidewalls. The clean-up ion beam etch contributes to further gouging of the underlying dielectric cap layers 402/202.

Advantageously, the sacrificial metal layer 204a is present covering/protecting the Logic area of substrate 202. Sacrificial metal layer 204a prevents any etching/gouging of the underlying dielectric cap layer 202 in the Logic area of substrate 202. Thus, sacrificial metal layer 204a prevents any unwanted exposure of the lower interconnect levels in the Logic area of substrate 202. For instance, use of sacrificial metal layer 204a prevents unwanted exposure of interconnects 104a in the logic area of substrate 202 which can undesirably lead to contamination during downstream processes.

Preferably, a different metal (or combination of metals) is used for sacrificial metal layer 204a than for the top electrodes 508a and 508b and bottom electrodes 504a and 504b. For instance, to use a simple, non-limiting example, if the sacrificial metal layer 204a is formed from TaN (see above), then the top electrodes 508a and 508b and bottom electrodes 504a and 504b can be formed from TiN, or vice versa. That way, sacrificial metal layer 204a can serve as an etch-selective barrier during the ion beam etching.

Next, a conformal dielectric encapsulation layer 802 is next deposited over the memory cells 702a and 702b, the dielectric cap layers 402/202 in between the memory cells 702a and 702b, and on the sacrificial metal layer 204a. See FIG. 8. Suitable materials for encapsulation layer 802 include, but are not limited to, SiN, SiCN and/or SiCNH. Encapsulation layer 802 can be deposited using a process such as CVD, ALD or PVD. According to an exemplary embodiment, encapsulation layer 802 has a thickness of from about 20 nm to about 200 nm and ranges therebetween.

An etch-back of encapsulation layer 802 is then performed to form spacers 902 along the sidewalls of memory cells 702a and 702b. See FIG. 9. A directional (anisotropic) etching process such as RIE can be employed for the etch back, which removes the encapsulation layer 802 from all horizontal surfaces. What remains are the spacers 902 shown in FIG. 9 along the (vertical) sidewalls of memory cells 702a and 702b.

Sacrificial metal layer 204a is then selectively removed from the Logic area of substrate 102. See FIG. 10. According to an exemplary embodiment, a non-directional (isotropic) etching process such as selective wet chemical etch is employed to remove sacrificial metal layer 204a. Removal of sacrificial metal layer 204a enables further metallization in the Logic area of substrate 102 to be performed as described in detail below. It is notable that the use of sacrificial metal layer 204a to cover and protect the dielectric in the Logic area of the substrate 102 during the ion beam etch of the MTJ stack in the Memory area yields a unique device structure. Namely, a thick dielectric cap layer 202 remains present over the Logic area of substrate 102. For instance, according to an exemplary embodiment, dielectric cap layer 202 in the final device structure has a thickness of from about 20 nm to about 100 nm and ranges therebetween. To look at it another way, without protection the over-etch and clean-up ion beam etch might reduce the thickness of the dielectric cap layer to less than 5 nm, and in some cases can even expose the underlying interconnects.

An interlayer dielectric (ILD) 1002 is then deposited over the Logic and Memory areas of the substrate 102, surrounding the memory cells 702a and 702b. Suitable materials for ILD 1002 include, but are not limited to, oxide low-κ materials such as SiOx and/or oxide ULK-ILD materials such as pSiCOH. ILD 1002 can be deposited using a process such as CVD, ALD or PVD. Following deposition, ILD 1002 is polished using a process such as CMP.

Figure 11:
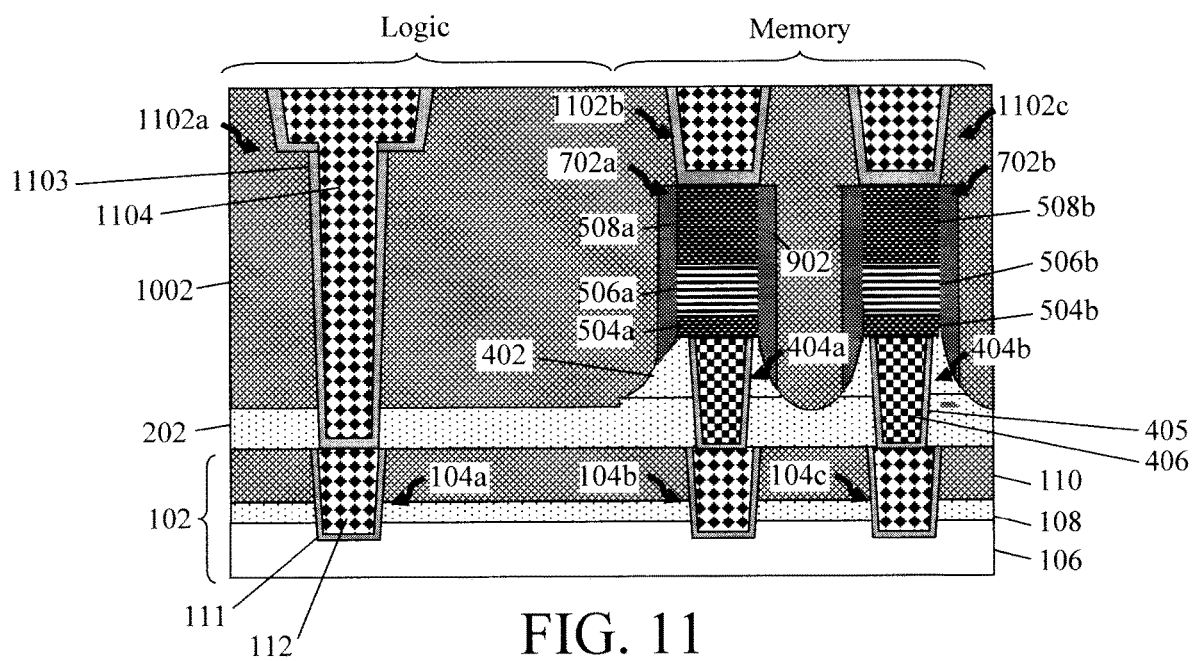
FIG. 11 is a cross-sectional diagram illustrating (third) interconnects having been formed in the ILD and/or in the first/second dielectric cap layers according to an embodiment of the present invention.

Third electrically conductive interconnects 1102a, 1102b and 1102c are formed in ILD 1002 and/or dielectric cap layers 402/202. See FIG. 11. Specifically, as shown in FIG. 11, interconnect 1102a is formed in ILD 1002 and cap layer 202 in contact with interconnect 104a in the Logic area of substrate 102, and interconnects 1102b and 1102c are formed in ILD 1002 in contact with top electrodes 508a and 508b of memory cells 702a and 702b, respectively.

According to an exemplary embodiment, interconnects 1102a, 1102b and 1102c are formed using standard lithography and etching techniques (see above) to first pattern vias and/or trenches in ILD 1002 and cap layer 202 and then filling the vias with a contact metal (or combination of metals) 1104. A directional (anisotropic) etching process such as RIE can be employed for patterning the vias and/or trenches. In some embodiments, a dual damascene process is employed. With a dual damascene process, a via and trench are patterned with the trench positioned over the via. See, for example, interconnect 1102a. When the trench is patterned before the via, it is referred to as a trench-first process. Conversely, when the via is patterned before the trench, it is referred to as a via-first process.

As provided above, suitable contact metals include, but are not limited to, Cu, W, Ni and/or Pt. The contact metal(s) 1104 can be deposited into the vias using a process such as evaporation, sputtering, or electrochemical plating. Following deposition, the overburden can be removed using a process such as CMP. Prior to depositing the contact metal(s) 1104 into the vias, a conformal barrier layer 1103 can be deposited into and lining the vias. Use of such a barrier layer 1103 helps to prevent diffusion of the contact metal(s) into the surrounding dielectric. As provided above, suitable barrier layer materials include, but are not limited to, Ta, TaN, Ti, and/or TiN. Additionally, a seed layer (not shown) can be deposited into and lining the vias prior to contact metal deposition, i.e., to facilitate plating of the contact metal into the vias.

In the example just described, the sacrificial metal layer was formed in the Logic area of the substrate to avoid dielectric gouging during the ion beam etch of the MTJ stacks in the Memory area of the substrate. However, with that configuration, gouging of the underlying dielectric can still occur in the memory area of the substrate around the base of the memory cells when the pitch of the memory array is greater than about 300 nm. Accordingly, embodiments are also contemplated herein where the sacrificial metal layer is extended to the Memory area of the substrate as well. Doing so requires a modification during patterning of the sacrificial metal layer as described by way of reference to FIGS. 12-19 in the following alternative exemplary embodiment.

The process begins in the same manner as described in conjunction with the description of FIG. 1, above, with a substrate 102 (including first dielectric layer 106, a second dielectric layer 108, and a third dielectric layer) having (electrically-conductive) interconnects 104a, 104b, 104c, etc. formed therein. Like structures are numbered alike in the figures, and each of these structures was described in detail above. Further, the same steps depicted in separate figures of the preceding embodiment may be combined into a single figure for brevity in the following example, with the understanding that reference can be made to the preceding embodiment for the details of each step.

Figure 12:
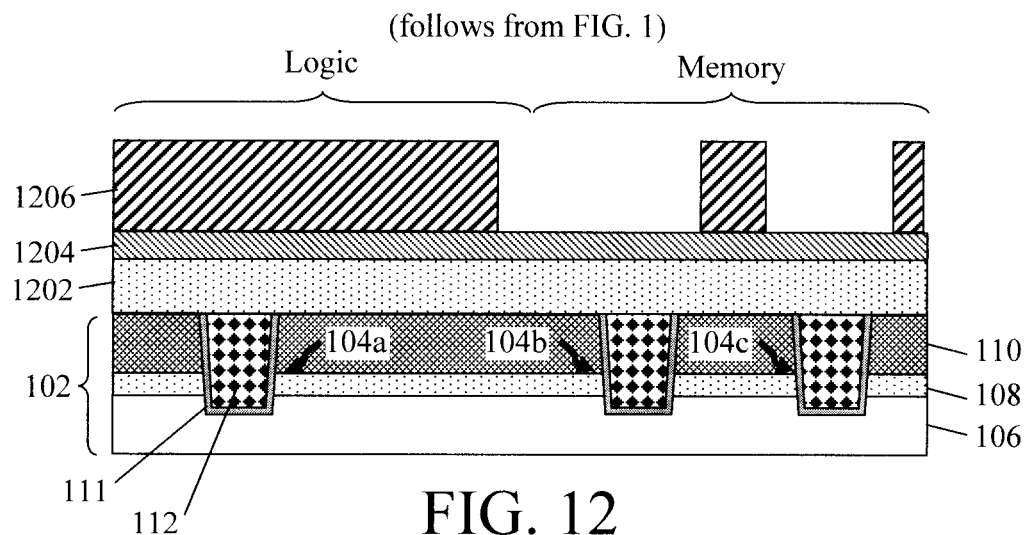
FIG. 12 is a cross-sectional diagram illustrating, according to an alternative embodiment which follows from FIG. 1, a (first) dielectric cap layer having been deposited onto the substrate over the first interconnects, a sacrificial metal layer having been deposited onto the first dielectric cap layer, and a patterned block mask having been formed over the sacrificial metal layer covering/masking sacrificial metal layer in the Logic and Memory areas according to an embodiment of the present invention.

Thus, following from FIG. 1, as shown in FIG. 12 a (first) dielectric cap layer 1202 is then deposited onto substrate 102 over interconnects 104a, 104b, 104c, etc. Suitable materials for dielectric cap layer 1202 include, but are not limited to, materials such as SiC, SiN SiCN and/or SiCNH. Dielectric cap layer 1202 can be deposited onto substrate 102 using a process such as CVD, ALD or PVD. According to an exemplary embodiment, dielectric cap layer 1202 has a thickness of from about 20 nm to about 100 nm and ranges therebetween.

A sacrificial metal layer 1204 is then deposited onto the dielectric cap layer 1202. Suitable materials for sacrificial metal layer 1204 include, but are not limited to, TaN and/or TiN. As described above, the material(s) selected for sacrificial metal layer 1204 should differ from those employed in the top and bottom electrode in the MRAM stack (see below) in order for sacrificial metal layer 1204 to protect the underlying dielectric during the MRAM stack ion beam etch. Sacrificial metal layer 1204 can be deposited onto dielectric cap layer 1202 using a process such as CVD, ALD or PVD. According to an exemplary embodiment, sacrificial metal layer 1204 has a thickness of from about 10 nm to about 100 nm and ranges therebetween. Notably, in this exemplary embodiment, sacrificial metal layer 1204 will serve to prevent gouging of dielectric cap layer 1202 in both the Logic and Memory areas during the ion beam etch of the MTJ.

Namely, a patterned block mask 1206 is next formed over sacrificial metal layer 1204 covering/masking sacrificial metal layer 1204 in the Logic and Memory areas. Standard lithography and etching techniques (see above) can be employed to pattern the block mask. Suitable block mask materials include, but are not limited to, organic planarizing layer (OPL) materials.

Figure 13:
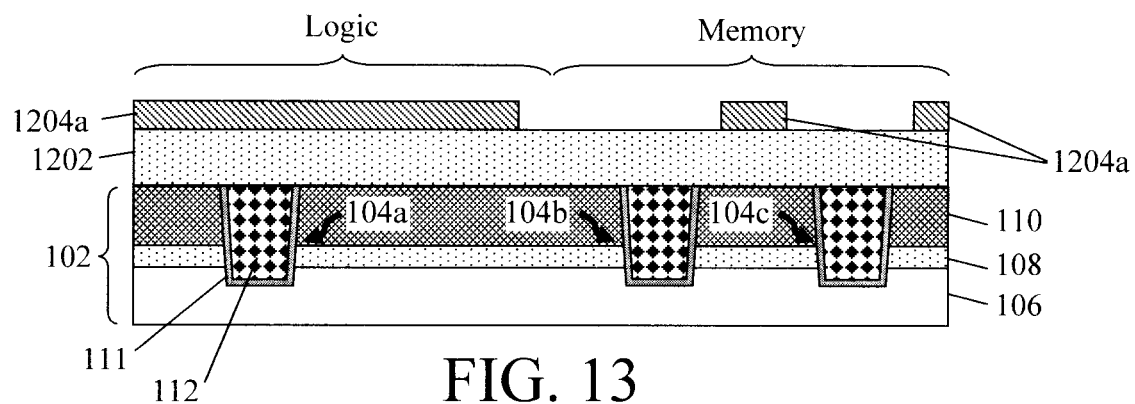
FIG. 13 is a cross-sectional diagram illustrating the sacrificial metal layer having been patterned using the block mask according to an embodiment of the present invention.
Figure 14:
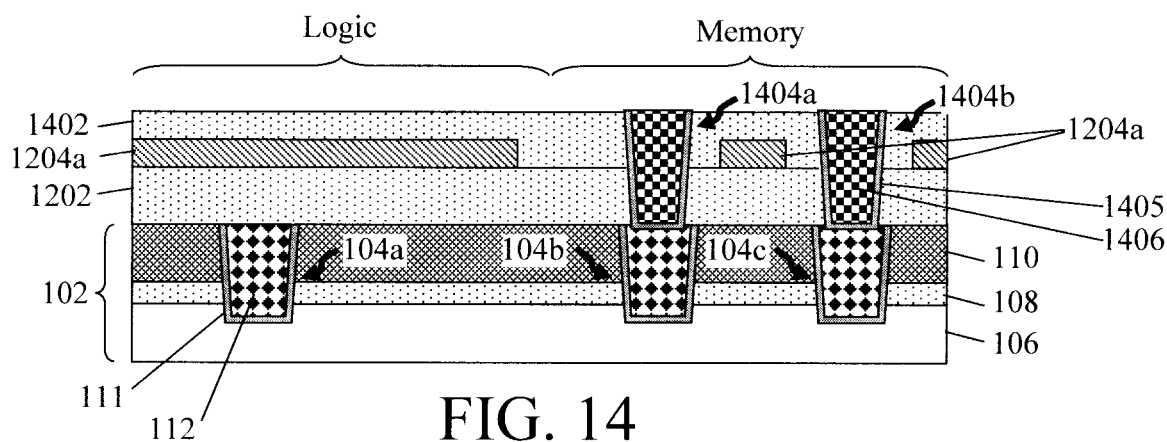
FIG. 14 is a cross-sectional diagram illustrating a (second) dielectric cap layer having been deposited onto the first dielectric cap layer over and burying the patterned sacrificial metal layer, and (second) interconnects having been formed in the first/second dielectric cap layers in contact with the first interconnects in the Memory area of the substrate according to an embodiment of the present invention.

As shown in FIG. 13, sacrificial metal layer 1204 is then patterned using block mask 1206. According to an exemplary embodiment, a selective directional (anisotropic) etching process such as metal-selective RIE is employed to pattern the sacrificial metal layer 1204. As a result of this patterning, sacrificial metal layer 1204 is now present over the Logic area as well as over the Memory area of substrate 102 in between interconnects 104b and 104c. The patterned portions of sacrificial metal layer 1204 that remain over dielectric cap layer 1202 in the Logic and Memory areas of substrate 202 are now given reference numeral 1204a. Following patterning of sacrificial metal layer 1204, the block mask 1206 is removed.

A (second) dielectric cap layer 1402 is then deposited onto dielectric cap layer 1202 over and burying the patterned portions 1204a of sacrificial metal layer 1204 in the Logic and Memory areas of substrate 102. See FIG. 14. Following deposition, dielectric cap layer 1402 is polished using a process such as CMP. According to an exemplary embodiment, the same material is used for dielectric cap layer 1402 as for dielectric cap layer 1202, e.g., SiC, SiN, SiCN and/or SiCNH. Dielectric cap layer 1402 can be deposited onto dielectric cap layer 1202 using a process such as CVD, ALD or PVD. According to an exemplary embodiment, dielectric cap layer 1402 has a thickness of from about 20 nm to about 100 nm and ranges therebetween.

Second electrically-conductive interconnects 1404a, 1404b, etc. are formed in dielectric cap layer 1202/dielectric cap layer 1402. In this exemplary embodiment, interconnects 1404a, 1404b, etc. are formed in dielectric cap layer 1202/dielectric cap layer 1402 over and in contact with interconnects 104b and 104c in the Memory area of substrate 202 in between the patterned portions 1204a of sacrificial metal layer 1204. Namely, the patterned portions 1204a of sacrificial metal layer 1204 fully cover the Logic area of substrate 102, while leaving openings over interconnects 104b and 104c in the Memory area of substrate 202. According to an exemplary embodiment, interconnects 1404a, 1404b, etc. are formed using standard lithography and etching techniques (see above) to first pattern vias in dielectric cap layer 1202/dielectric cap layer 1402 and then filling the vias with a contact metal (or combination of metals) 1406. A directional (anisotropic) etching process such as RIE can be employed for patterning the vias. As provided above, suitable contact metals include, but are not limited to, Cu, W, Ni and/or Pt. The contact metal(s) 1406 can be deposited into the vias using a process such as CVD, PVD, or electrochemical plating. Following deposition, the overburden can be removed using a process such as CMP. Prior to depositing the contact metal(s) 1406 into the vias, a conformal barrier layer 1405 can be deposited into and lining the vias. As provided above, use of such a barrier layer 1405 helps to prevent diffusion of the contact metal(s) into the surrounding dielectric. As provided above, suitable barrier layer materials include, but are not limited to, Ta, TaN, Ti, and/or TiN. Additionally, a seed layer (not shown) can be deposited into and lining the vias prior to contact metal deposition, i.e., to facilitate plating of the contact metal into the vias.

Figure 15:
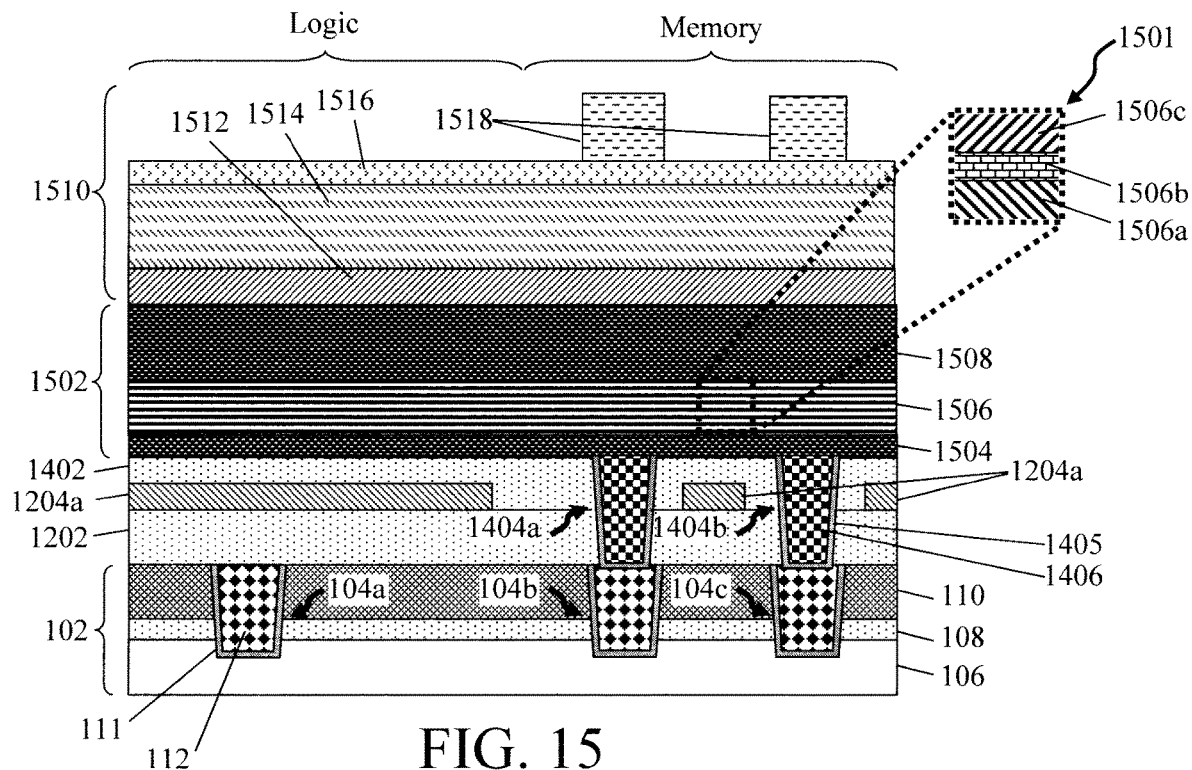
FIG. 15 is a cross-sectional diagram illustrating an MRAM stack having been formed on the first/second dielectric cap layers over the first/second interconnects, and a lithographic stack having been formed on the MRAM stack according to an embodiment of the present invention.
Figure 16:
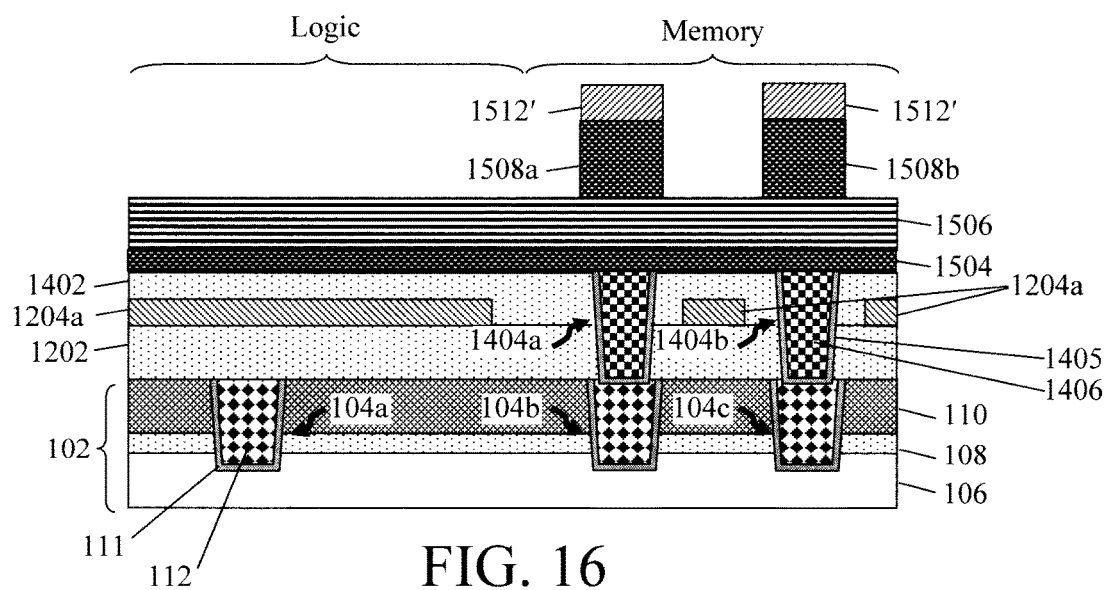
FIG. 16 is a cross-sectional diagram illustrating the lithographic stack having been used to pattern a top electrode layer of the MRAM stack into individual top electrodes according to an embodiment of the present invention.

An MRAM stack 1502 is then formed on dielectric cap layer 1202/dielectric cap layer 1402 over interconnects 104b and 104c/interconnects 1404a, 1404b, etc. As shown in FIG. 15, MRAM stack 1502 includes a bottom electrode layer 1504 disposed on dielectric cap layer 1402, an MTJ layer 1506 disposed on the bottom electrode layer 1504, and a top electrode layer 1508 disposed on the MTJ layer 1506. As provided above, suitable materials for the bottom electrode layer 1504 and the top electrode layer 1508 include, but are not limited to, Nb, NbN, W, WN, Ta, TaN, Ti, TiN, Ru, Mo, Cr, V, Pd, Pt, Rh, Sc and/or Al. A process such as PVD or CVD can be employed to deposit bottom electrode layer 1504 onto the dielectric cap layer 1402 and/or to deposit top electrode layer 1508 onto the MTJ layer 1506. According to an exemplary embodiment, bottom electrode layer 1504 has thickness of from about 5 nm to about 30 nm and ranges therebetween, and top electrode layer 1508 has a thickness of from about 50 nm to about 150 nm and ranges therebetween.

MTJ layer 1506 can have a variety of different configurations. In general, however, MTJ layer 1506 includes at least one fixed (or reference) layer 1506a separated from at least one free layer 1506c by a tunnel barrier layer 1506b. See magnified view 1501. As provided above, suitable materials for the fixed layer(s) 1506a and the free layer(s) 1506c include, but are not limited to, a metal or combination of metals such as Co, Fe, Ni, Mn, Pt, Pd, Ru, and combinations thereof, e.g., alloys containing at least one of the foregoing metals such as CoFeB. A process such as evaporation or sputtering can be employed to deposit fixed layer(s) 1506a onto bottom electrode layer 1504 and/or to deposit free layer(s) 1506c onto tunnel barrier layer 1506b. According to an exemplary embodiment, fixed layer(s) 1506a and free layer(s) 1506c each have a thickness of from about 2 nm to about 10 nm and ranges therebetween. As provided above, suitable materials for tunnel barrier layer 1506b include, but are not limited to, AlOx and/or MgO. A process such as CVD, ALD or PVD can be employed to deposit tunnel barrier layer 1506b onto bottom electrode layer 1504. According to an exemplary embodiment, tunnel barrier layer 1506b has a thickness of from about 2 nm to about 10 nm and ranges therebetween. In order to pattern MRAM stack 1502, a standard lithographic stack 1510 is formed on the MRAM stack 1502. As shown in FIG. 15, lithographic stack 1510 includes a hardmask layer 1512 (e.g., SiN) disposed on the MRAM stack 1502, an OPL 1514 disposed on the hardmask layer 1512, an ARC layer 1516 disposed on the OPL 1514, and a patterned photoresist 1518 disposed on the ARC layer 1516. The patterned photoresist 1518 marks the footprint and location of MRAM memory cells that will be patterned in MRAM stack 1502 over interconnects 104b and 104c/interconnects 1404a, 1404b, etc. in the memory area of the substrate 102 (see below).

Standard lithography and etching techniques (see above) using, e.g., a directional (anisotropic) etching process such as RIE, are then employed to transfer the pattern from patterned photoresist 1518 to hardmask layer 1512, after which any remaining OPL 1514, ARC layer 1516 and photoresist 1518 are removed. See FIG. 16. The patterned hardmask layer 1512 is now given the reference numeral 1512'. The pattern from patterned hardmask layer 1512' is then transferred to the top electrode layer 1508 to pattern the top electrode layer 1508 into at least a first top electrode 1508a and a second top electrode 1508b. According to an exemplary embodiment, ion beam etching is used to pattern the top electrode layer 1508.

An ion beam etch of MTJ layer 1506 and bottom electrode layer 1504 is then performed to form at least a first memory cell 1702a and a second memory cell 1702b from MRAM stack 1502 in the memory area of the substrate 102 (after which patterned hardmask layer 1512' is removed). See FIG.

Figure 17:
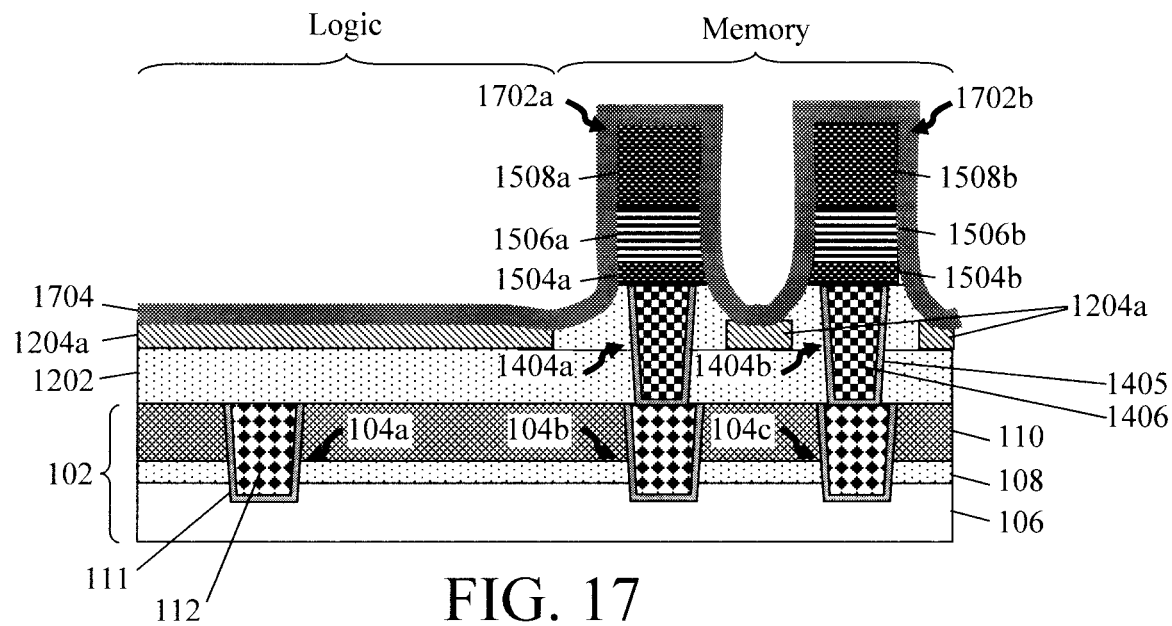
FIG. 17 is a cross-sectional diagram illustrating an etch of an MTJ layer and a bottom electrode layer of the MRAM stack having been performed to form at least a first memory cell and a second memory cell from the MRAM stack in the Memory area of the substrate, while the patterned sacrificial metal layer protects the underlying dielectric cap layer in the Logic and Memory areas of the substrate, and a conformal dielectric encapsulation layer having been deposited over the memory cells according to an embodiment of the present invention.
Figure 18:
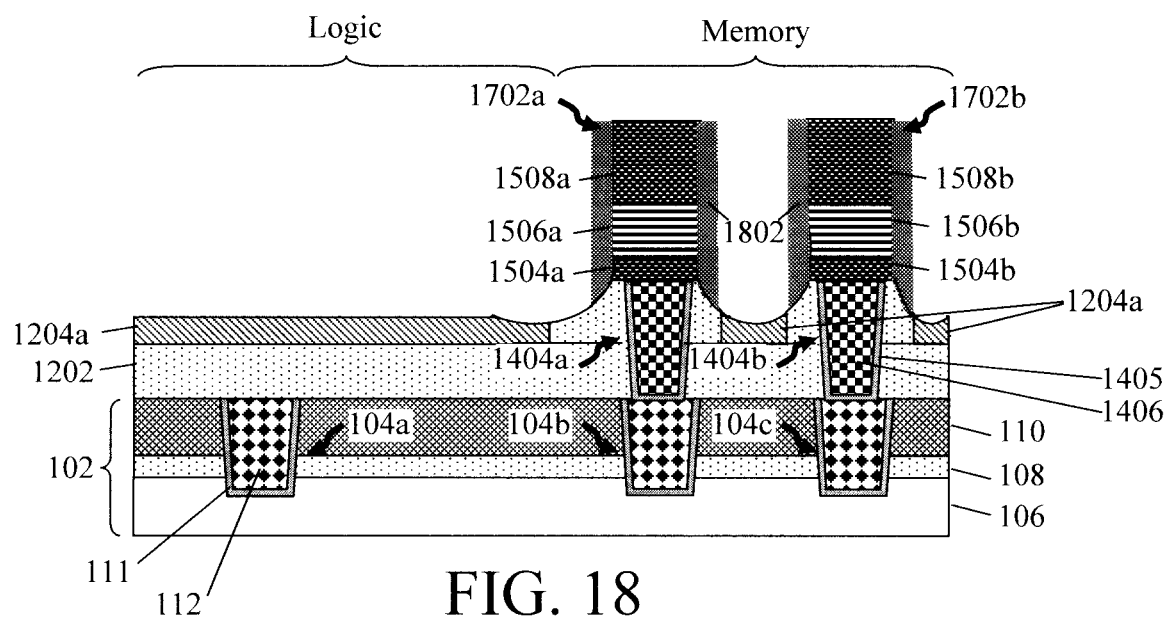
FIG. 18 is a cross-sectional diagram illustrating an etch-back of the encapsulation layer having been performed to form spacers along the sidewalls of the memory cells according to an embodiment of the present invention.

17. The patterned MTJ layer 1506 forms at least a first MTJ 1506a and a second MTJ 1506b in memory cell 1702a and memory cell 1702b, respectively. The patterned bottom electrode layer 1504 forms at least a first bottom electrode 1504a and a second bottom electrode 1504b in memory cell 1702a and memory cell 1702b, respectively. As shown in FIG. 17, memory cell 1702a is formed over interconnects 1404a/104b, and memory cell 1702b is formed over interconnects 1404b/104c, etc.

The ion beam etch of MTJ layer 1506 and bottom electrode layer 1504 lands on the underlying dielectric, i.e., dielectric cap layers 1402/1202. In the same manner as described above, according to an exemplary embodiment, this ion beam etch to form memory cells 1702a and 1702b involves an over-etch to reduce foot flares in the bottom electrodes 1504a and 1504b, followed by a clean-up ion beam etching (i.e., to remove this redistributed metal/dielectric from the MTJ sidewalls) both of which can contribute to gouging of the underlying dielectric if left unprotected. Advantageously, however, in the present example the patterned portions 1204a of sacrificial metal layer 1204 prevent gouging of the underlying dielectric cap layers 1402/1202 during the over-etch and clean-up ion beam etch in both the Logic and Memory areas of substrate 202, including at the base of memory cells 1702a and 1702b. See FIG. 17 where patterned portions 1204a of sacrificial metal layer 1204 prevents any etching/gouging of the underlying dielectric cap layers 1402/1202 in the Logic and Memory areas of substrate 202.

As highlighted above, it is preferable to use a different metal (or combination of metals) for sacrificial metal layer 1204 than for the top electrodes 1508a and 1508b and bottom electrodes 1504a and 1504b. For instance, to use the same simple, non-limiting example as above, if the sacrificial metal layer 1204 is formed from TaN, then the top electrodes 1508a and 1508b and bottom electrodes 1504a and 1504b can be formed from TiN, or vice versa. That way, patterned portions 1204a of sacrificial metal layer 1204 can serve as an etch-selective barrier during the ion beam etch.

Next, a conformal dielectric encapsulation layer 1704 is next deposited over the memory cells 1702a and 1702b, and on the patterned portions 1204a of sacrificial metal layer 1204. As provided above, suitable materials for encapsulation layer 1704 include, but are not limited to, SiN and/or SiCN. Encapsulation layer 1704 can be deposited using a process such as CVD, ALD or PVD. According to an exemplary embodiment, encapsulation layer 1704 has a thickness of from about 20 nm to about 200 nm and ranges therebetween.

An etch-back of encapsulation layer 1704 is then performed to form spacers 1802 along the sidewalls of memory cells 1702a and 1702b. See FIG. 18. A directional (anisotropic) etching process such as RIE can be employed for the etch back, which removes the encapsulation layer 1704 from all horizontal surfaces. What remains are the spacers 1802 shown in FIG. 18 along the (vertical) sidewalls of memory cells 1702a and 1702b.

The patterned portions 1204a of sacrificial metal layer 1204 are then selectively removed from the Logic and Memory areas of substrate 102. See FIG. 19. According to an exemplary embodiment, a non-directional (isotropic) etching process such as selective wet chemical etch is employed to remove the patterned portions 1204a of sacrificial metal layer 1204. Removal of the patterned portions 1204a of sacrificial metal layer 1204 enables further metallization in substrate 102 to be performed as described in detail below. It is notable that the use of sacrificial metal layer 1204 to cover and protect the dielectric in the logic area of the substrate 102 during the ion beam etch of the MTJ stack in the memory area yields a unique device structure. Namely, a thick dielectric cap layer 1202 remains present over both the Logic and Memory areas of substrate 102. For instance, according to an exemplary embodiment, dielectric cap layer 1202 in the final device structure has a thickness of from about 20 nm to about 100 nm and ranges therebetween in both the Logic and Memory areas of substrate 102. To look at it another way, without protection the over-etch and clean-up ion beam etch might reduce the thickness of the dielectric cap layer to less than 5 nm, and in some cases can even expose the underlying interconnects.

An ILD 1902 is then deposited over the logic and memory areas of the substrate 102, surrounding the memory cells 1702a and 1702b. Suitable materials for ILD 1902 include, but are not limited to, oxide low-κ materials such as SiOx and/or oxide ULK-ILD materials such as pSiCOH. ILD 1902 can be deposited using a process such as CVD, ALD or PVD. Following deposition, ILD 1902 is polished using a process such as CMP.

Figure 19:
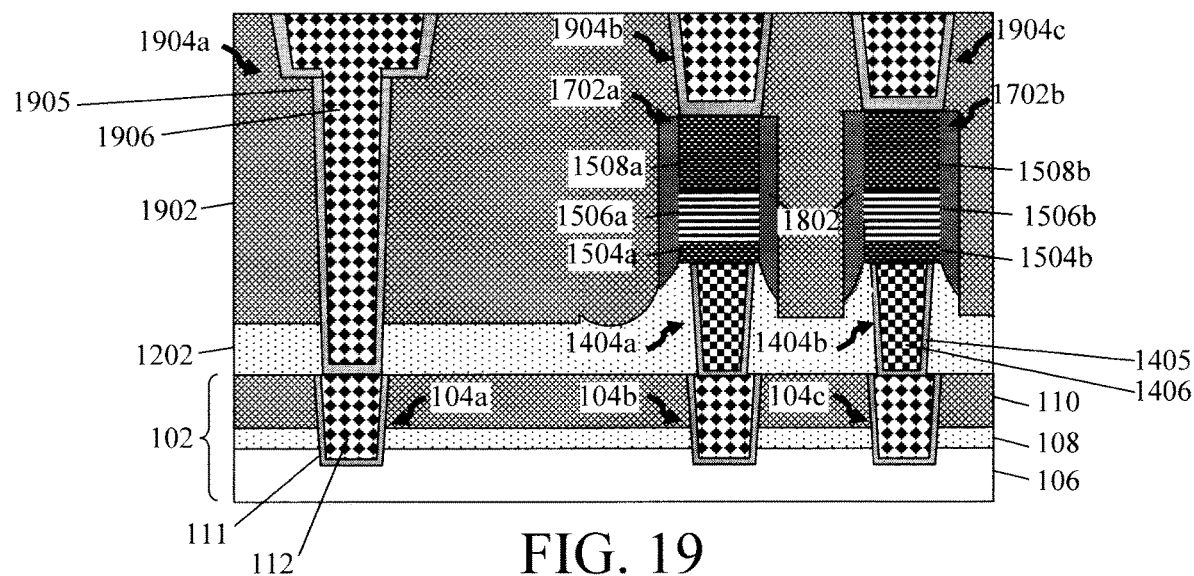
FIG. 19 is a cross-sectional diagram illustrating the patterned sacrificial metal layer having been removed, an ILD having been deposited over the Logic and Memory areas of the substrate, surrounding the memory cells, and (third) interconnects having been formed in the ILD and/or in the first/second dielectric cap layers according to an embodiment of the present invention.

Third electrically conductive interconnects 1904a, 1904b and 1904c are then formed in ILD 1902 and/or dielectric cap layers 1402/1202. Specifically, as shown in FIG. 19, interconnect 1904a is formed in ILD 1902 and cap layer 1202 in contact with interconnect 104a in the Logic area of substrate 102, and interconnects 1904b and 1904c are formed in ILD 1902 in contact with top electrodes 1508a and 1508b of memory cells 1702a and 1702b, respectively. According to an exemplary embodiment, interconnects 1904a, 1904b and 1904c are formed using standard lithography and etching techniques (see above) to first pattern vias and/or trenches in ILD 1902 and cap layer 1202 and then filling the vias with a contact metal (or combination of metals) 1906. A directional (anisotropic) etching process such as RIE can be employed for patterning the vias and/or trenches. In some embodiments, a dual damascene process is employed. See, for example, interconnect 1904a.

As provided above, suitable contact metals include, but are not limited to, Cu, W, Ni and/or Pt. The contact metal(s) 1906 can be deposited into the vias using a process such as evaporation, sputtering, or electrochemical plating. Following deposition, the overburden can be removed using a process such as CMP. Prior to depositing the contact metal(s) 1906 into the vias, a conformal barrier layer 1905 can be deposited into and lining the vias. Use of such a barrier layer 1905 helps to prevent diffusion of the contact metal(s) into the surrounding dielectric. As provided above, suitable barrier layer materials include, but are not limited to, Ta, TaN, Ti, and/or TiN. Additionally, a seed layer (not shown) can be deposited into and lining the vias prior to contact metal deposition, i.e., to facilitate plating of the contact metal into the vias.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a magnetic random access memory (MRAM) device, the method comprising the steps of:

depositing a first dielectric cap layer onto a substrate over a logic area and a memory area of the substrate;

depositing a sacrificial metal layer onto the first dielectric cap layer;

patterning the sacrificial metal layer, wherein the patterned sacrificial metal layer is present over the first dielectric cap layer in at least the logic area of the substrate;

depositing a second dielectric cap layer onto the first dielectric cap layer over the patterned sacrificial metal layer;

forming an MRAM stack on the second dielectric cap layer;

patterning the MRAM stack using ion beam etching into at least one memory cell in the memory area of the substrate, wherein the patterned sacrificial metal layer protects the first dielectric cap layer in the logic area of the substrate during the patterning of the MRAM stack; and removing the patterned sacrificial metal layer.

2. The method of claim 1, wherein the substrate comprises interconnects formed therein in both the logic area and the memory area.

3. The method of claim 1, wherein the first dielectric cap layer and the second dielectric cap layer each comprises a material selected from the group consisting of: silicon carbide (SiC), silicon nitride (SiN), silicon carbon nitride (SiCN), hydrogen containing silicon carbon nitride (SiCNH), and combinations thereof.

4. The method of claim 1, wherein the sacrificial metal layer comprises a material selected from the group consisting of: tantalum nitride (TaN), titanium nitride (TiN), and combinations thereof.

5. The method of claim 1, wherein the patterned sacrificial metal layer is also present over the first dielectric cap layer in the memory area of the substrate.

6. The method of claim 5, wherein the patterned sacrificial metal layer protects the first dielectric cap layer in the memory area of the substrate during the patterning of the MRAM stack.

7. The method of claim 1, further comprising the step of:
forming interconnects in the first dielectric cap layer and the second dielectric cap layer in the memory area of the substrate.

8. The method of claim 1, wherein the MRAM stack comprises:
a bottom electrode layer disposed on the second dielectric cap layer;
a magnetic tunnel junction (MTJ) layer disposed on the bottom electrode layer; and
a top electrode layer disposed on the MTJ layer.

9. The method of claim 8, wherein, following the patterning of the MRAM stack, the bottom electrode layer forms a bottom electrode of the at least one memory cell, the MTJ layer forms am MTJ of the at least one memory cell, and the top electrode layer forms a top electrode of the at least one memory cell.

10. The method of claim 9, further comprising the steps of:
depositing an interlayer dielectric (ILD) over the substrate and surrounding the at least one memory cell; and
forming interconnects in the ILD in contact with the top electrode of the at least one memory cell.

11. The method of claim 1, further comprising the step of:
forming spacers along sidewalls of the at least one memory cell prior to removing the patterned sacrificial metal layer.

12. The method of claim 11, wherein the spacers comprise a material selected from the group consisting of: SiN, SiCN, SiCNH and combinations thereof.

13. A method of forming an MRAM device, the method comprising the steps of:
depositing a first dielectric cap layer onto a substrate over a logic area and a memory area of the substrate;
depositing a sacrificial metal layer onto the first dielectric cap layer;
patterning the sacrificial metal layer, wherein the patterned sacrificial metal layer is present over the first dielectric cap layer the logic area and in the memory area of the substrate;
depositing a second dielectric cap layer onto the first dielectric cap layer over the patterned sacrificial metal layer;
forming an MRAM stack on the second dielectric cap layer;
patterning the MRAM stack using ion beam etching into at least one memory cell in the memory area of the substrate, wherein the patterned sacrificial metal layer protects the first dielectric cap layer in the logic area and in the memory area of the substrate during the patterning of the MRAM stack;
forming spacers along sidewalls of the at least one memory cell prior to removing the patterned sacrificial metal layer; and
removing the patterned sacrificial metal layer.

14. The method of claim 13, wherein the sacrificial metal layer comprises a material selected from the group consisting of: TaN, TiN, and combinations thereof.

15. The method of claim 13, wherein the substrate comprises first interconnects formed therein in both the logic area and the memory area, the method further comprising the steps of:
forming second interconnects in the first dielectric cap layer and the second dielectric cap layer in contact with the first interconnects in the memory area of the substrate;
depositing an ILD over the substrate and surrounding the at least one memory cell; and
forming third interconnects in the ILD in contact with the top electrode of the at least one memory cell.

16. The method of claim 13, wherein the MRAM stack comprises:
a bottom electrode layer disposed on the second dielectric cap layer;
an MTJ layer disposed on the bottom electrode layer; and
a top electrode layer disposed on the MTJ layer.

17. The method of claim 16, wherein, following the patterning of the MRAM stack, the bottom electrode layer forms a bottom electrode of the at least one memory cell, the MTJ layer forms an MTJ of the at least one memory cell, and the top electrode layer forms a top electrode of the at least one memory cell.

* * * * *